(12) United States Patent
Karino (10) Patent No.: US 9,721,939 B2
(45) Date of Patent: Aug. 1, 2017

(54) SEMICONDUCTOR DEVICE

(71) Applicant: FUJI ELECTRIC CO., LTD., Kawasaki-shi (JP)

(72) Inventor: Taichi Karino, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 13/940,952

(22) Filed: Jul. 12, 2013

(65) Prior Publication Data

US 2014/0042544 A1    Feb. 13, 2014

(30) Foreign Application Priority Data

Aug. 9, 2012    (JP) ................. 2012-177003

(51) Int. Cl.
*H01L 29/66* (2006.01)
*H01L 27/02* (2006.01)
(Continued)

(52) U.S. Cl.
CPC ...... *H01L 27/0248* (2013.01); *H01L 27/0277* (2013.01); *H01L 29/0607* (2013.01); (Continued)

(58) Field of Classification Search
CPC ............. H01L 21/8248; H01L 21/8249; H01L 27/0259; H01L 27/0262; H01L 29/0601; (Continued)

(56) References Cited

U.S. PATENT DOCUMENTS

| | | | | |
|---|---|---|---|---|
| 5,629,545 A * | 5/1997 | Leach | ................ | H01L 27/0251 257/357 |
| 6,066,879 A * | 5/2000 | Lee | ..................... | H01L 27/0262 257/355 |
| 7,154,150 B2 * | 12/2006 | Hu | ....................... | H01L 27/0259 257/173 |
| 7,355,252 B2 * | 4/2008 | Kim | .................... | H01L 27/0266 257/355 |

(Continued)

FOREIGN PATENT DOCUMENTS

| | | |
|---|---|---|
| JP | 2001-320047 A | 11/2001 |
| JP | 2002-094063 A | 3/2002 |

(Continued)

*Primary Examiner* — Cheung Lee
*Assistant Examiner* — Stephen C Smith
(74) *Attorney, Agent, or Firm* — Rossi, Kimms & McDowell LLP (57) ABSTRACT

Aspects of the invention provide a compact semiconductor device having a surge protection element, which can reliably protect against surge and is unlikely to be affected by manufacturing variation. By forming a parasitic n-p-n transistor on a guard ring, and adopting the parasitic n-p-n transistor as a surge protection element, it is possible to provide a compact semiconductor device having a surge protection element. Also, by adopting the parasitic n-p-n transistor as a surge protection element, it is possible to reduce the operating resistance in comparison with when using a parasitic n-p-n transistor as a surge protection element, and thus possible to improve the surge protection function. Further, by providing one surge protection element on the guard ring, rather than providing a surge protection element in each cell, it is possible minimize the effect of manufacturing variation (i.e., in-plane variation) on the surge protection function.

8 Claims, 10 Drawing Sheets

(51) Int. Cl.
*H01L 29/06* (2006.01)
*H01L 29/78* (2006.01)
*H01L 29/423* (2006.01)

(52) U.S. Cl.
CPC ...... *H01L 29/0619* (2013.01); *H01L 29/7817* (2013.01); *H01L 29/7823* (2013.01); *H01L 29/0696* (2013.01); *H01L 29/42368* (2013.01)

(58) Field of Classification Search
CPC ............ H01L 29/0607; H01L 29/0262; H01L 29/1305; H01L 29/0634; H01L 29/063; H01L 29/0619; H01L 29/0626; H01L 29/0623; H01L 29/7816; H01L 29/7817; H01L 29/7823; H01L 29/7826; H01L 27/0248; H01L 27/0277; H01L 29/42368; H01L 2924/1305; H01L 2924/13052; H01L 29/7424; H01L 29/7811
USPC ......................................... 257/494, 546–552
See application file for complete search history.

(56) References Cited

U.S. PATENT DOCUMENTS

| | | | |
|---|---|---|---|
| 8,507,981 B2* | 8/2013 | Chen | H01L 29/41758 257/335 |
| 2001/0025961 A1 | 10/2001 | Nakamura et al. | |
| 2002/0030238 A1 | 3/2002 | Nakamura et al. | |
| 2002/0149059 A1* | 10/2002 | Ker | H01L 27/0277 257/355 |
| 2006/0033163 A1* | 2/2006 | Chen | H01L 27/0277 257/355 |
| 2007/0246738 A1 | 10/2007 | Otake | |
| 2010/0078709 A1* | 4/2010 | Ogura | H01L 27/0248 257/328 |

FOREIGN PATENT DOCUMENTS

| | | |
|---|---|---|
| JP | 2005-183499 A | 7/2005 |
| JP | 2007-294614 A | 11/2007 |

* cited by examiner

SEMICONDUCTOR DEVICE

BACKGROUND OF THE INVENTION

1. Technical Field

Embodiments of the invention relate to semiconductor devices, and, in particular, semiconductor devices that include a surge protection element, such as an ESD protection element.

2. Related Art

Several features generally demanded of semiconductor devices used in automobiles include, for example, a low on-state resistance, high withstand, and low cost. Together with a low on-state resistance, a high surge withstand is demanded of the semiconductor devices used in the load drive of an automobile lamp, relay, or the like, as electromagnetic noise from a surge voltage caused by electrostatic discharge (ESD), an induction load (L load), or the like, is applied from an output terminal thereof.

Also, in an integrated circuit, in order to prevent an excessive current flowing through an internal circuit configuring the integrated circuit, and the internal circuit being destroyed, when a surge (for example, an ESD surge) is applied from an input terminal or output terminal, a surge protection element such as an ESD protection element is formed on the same chip as the internal circuit.

Figure 7:
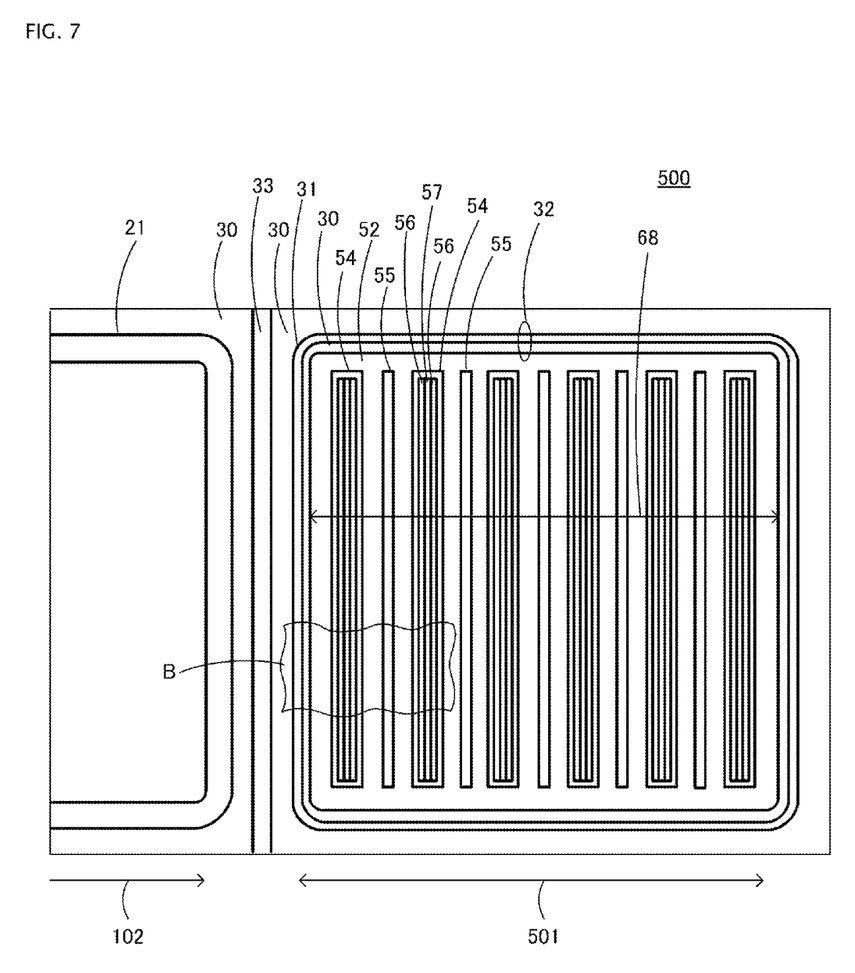
FIG. 7 is a main portion plan view of a conventional semiconductor device 500.
Figure 8A:
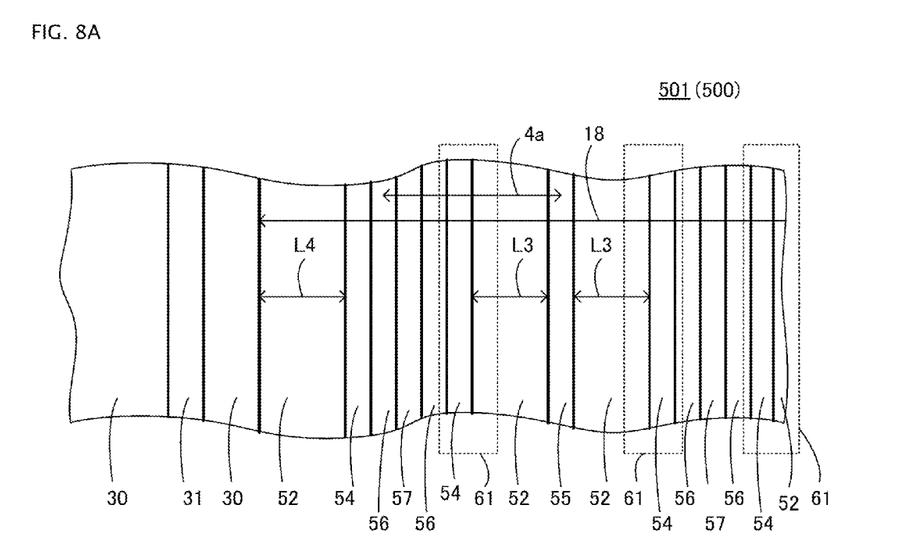
FIG. 8A is a main portion plan view of an output stage MOSFET 501.
Figure 8B:
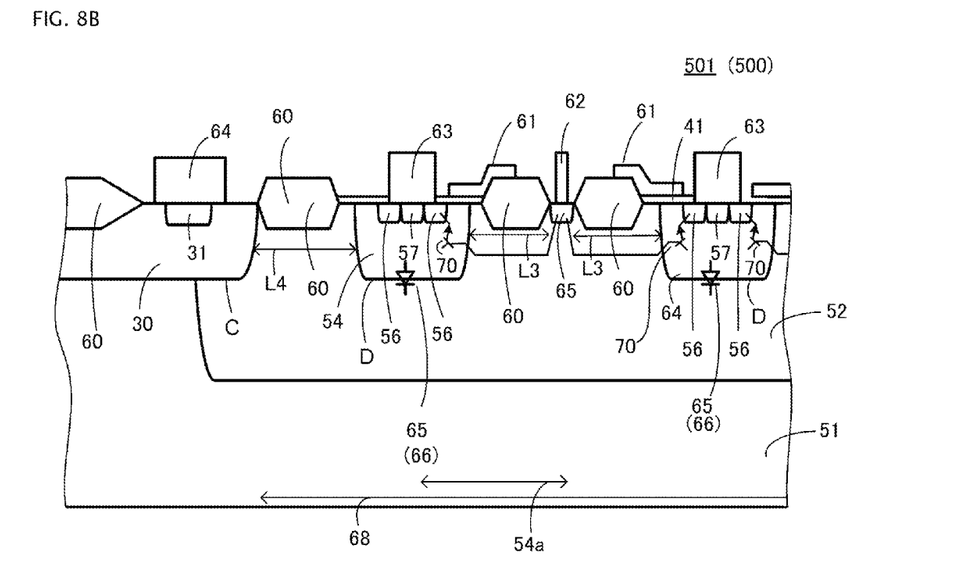
FIG. 8B is a main portion sectional view taken along an X-X line of FIG. 8A.
Figure 9:
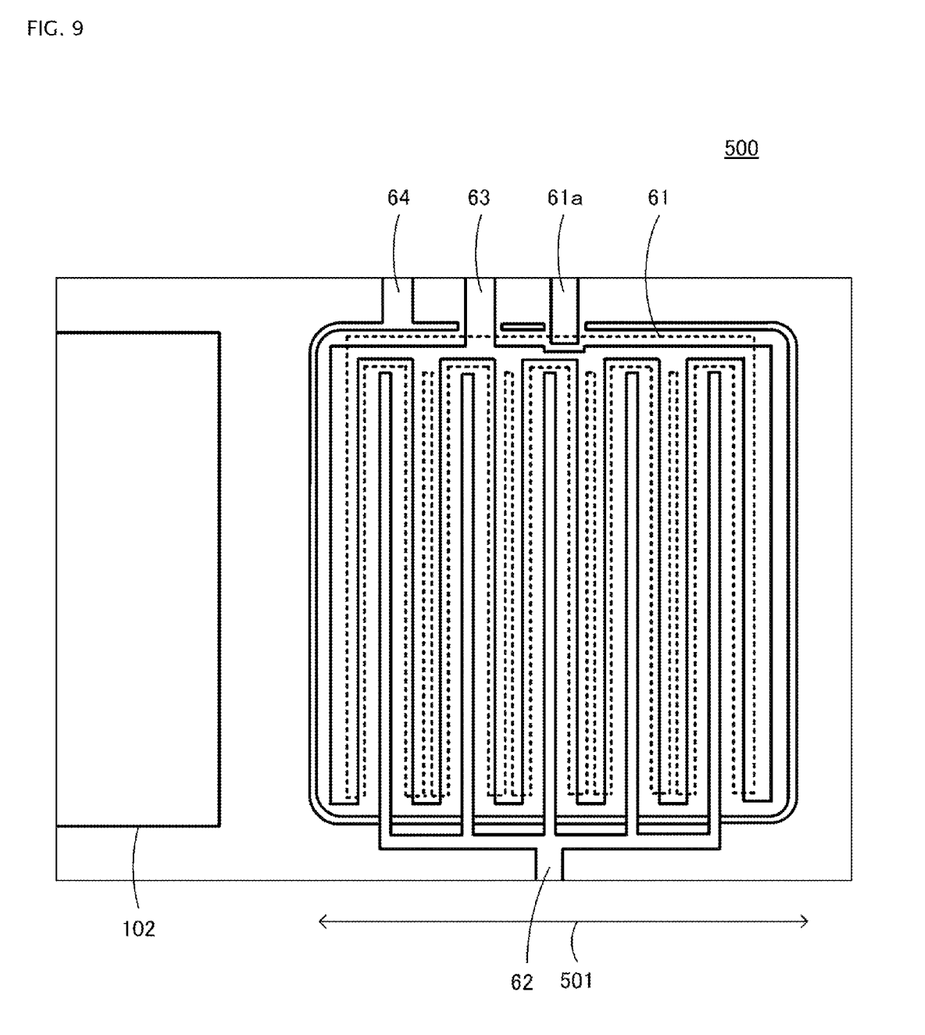
FIG. 9 is a main portion plan view of electrode wiring of the semiconductor device 500 of FIG. 9.

FIG. 7 is a main portion plan view of a conventional semiconductor device 500. FIGS. 8A and 8B are enlarged views of a B portion of FIG. 7, wherein FIG. 8A is a main portion plan view of an output stage MOSFET 501, and FIG. 8B is a main portion sectional view taken along an X-X line of FIG. 8A. FIG. 9 is a main portion plan view of electrode wiring of the semiconductor device 500 of FIG. 7.

In FIGS. 7 to 9, the semiconductor device 500 includes an n-type well region 52 disposed in a surface layer of a p-type semiconductor substrate 51, a plurality of (lateral n-type MOSFET) stripe-form p-type well regions 54 disposed in the n-type well region 52 and configuring a cell of an output stage MOSFET 501, stripe-form n-type source regions 56 disposed in a surface layer of the p-type well region 54, and a stripe-form p-type contact region 57 disposed sandwiched by the n-type source regions 56. The semiconductor device 500 includes a gate electrode 61, formed of polysilicon, disposed across a gate oxide film 41 on the p-type well region 54 sandwiched by the n-type source region 56 and n-type well region 52, and a stripe-form n-type drain region 55 disposed distanced from the p-type well region 54. A LOCOS 60 is disposed between the p-type well region 54 and n-type drain region 55. The semiconductor device 500 includes a p-type well region 30 disposed so as to enclose the p-type well region 54 group, and a ring-form p⁺ region 31 disposed in a surface layer of the p-type well region 30. A guard ring 32 is configured of the p-type well region 30 and p⁺ region 31.

Also, a parasitic diode 65 is configured of the p-type well region 54 and n-type well region 52 configuring the cell of the output stage MOSFET 501. The parasitic diode 65 forms a surge protection element 66.

An n-type well region 21 forming an integrated circuit 102 is formed distanced from the n-type well region 52 in a surface layer of the p-type semiconductor substrate 51. The n-type well region 21 is in contact with the p-type well region 30, and a p⁺ region 33 is disposed in the p-type well region 30 between the n-type well region 52 and n-type well region 21.

A distance L4 of the n-type well region 52 between the p-type well region 30 of the guard ring 32 and the p-type well region 54 configuring a cell 54a of the output stage MOSFET 501 is longer than a distance L3 of the n-type well region 52 (drift region) between the p-type well region 54 and n-type drain region 55 of the output stage MOSFET 501. This is so that avalanche will occur in a p-n junction D between the p-type well region 54 configuring the cell 54a of the output stage MOSFET 501 and the n-type well region 52 before occurring in a p-n junction C between the p-type well region 30 and n-type well region 52 on the guard ring 32 side when a surge such as an ESD is applied to the n-type drain region 55. The semiconductor device 500 is protected from the surge by avalanche occurring simultaneously in the p-n junctions D between the p-type well regions 54 configuring the cells and the n-type well region 52. The cell 54a configuring an active region 68 (the device region excluding the guard ring 32) of the output stage MOSFET 501 ranges from the center of the p-type contact region 57 to the center of the n-type drain region 55, is configured of the n-type source region 56, p-type well region 54, n-type drift region (n-well region 52), and n-type drain region 55, and a plurality thereof are disposed.

In FIG. 9, ground wiring 64, gate wiring 61a, source electrode wiring 63, and drain electrode wiring 62 are formed of aluminum wiring, and the aluminum wirings are disposed on an unshown interlayer insulating film on the n-type well region 52 or LOCOS 60. Each electrode wiring and semiconductor region, and the gate electrode 61 and gate wiring 61a, are connected via a contact hole formed in the interlayer insulating film.

Figure 10:
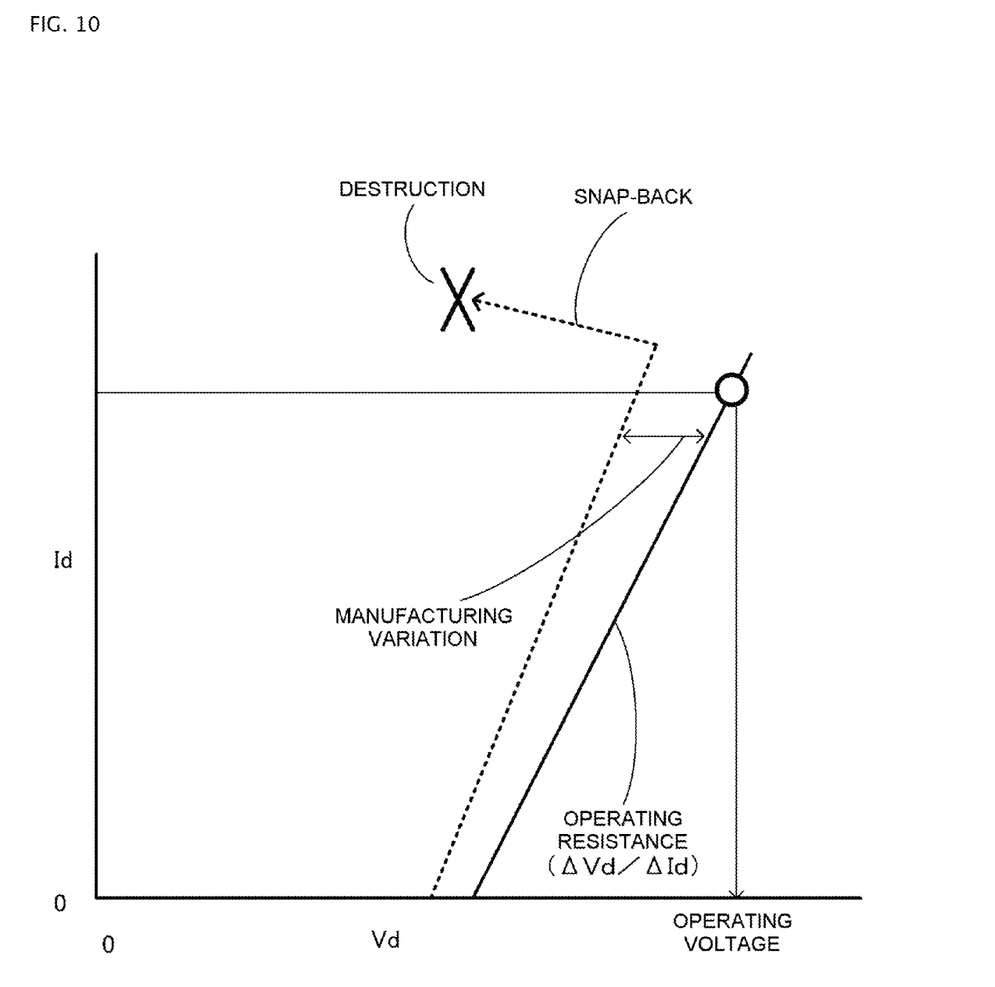
FIG. 10 is a current (Id)-voltage (Vd) characteristic diagram for the output stage MOSFET 501.

FIG. 10 is a current (Id)-voltage (Vd) characteristic diagram for the output stage MOSFET 501. Id is the drain current of the output stage MOSFET 501, while Vd is the drain voltage of the output stage MOSFET 501. Id also indicates a surge current flowing through the output stage MOSFET 501 and the collector current of the parasitic diode 65. Also, Vd also indicates a surge voltage applied to the output stage MOSFET 501 and a surge voltage applied to the parasitic diode 65.

The drain current (Id) begins to flow at the point at which the drain voltage (Vd) of the output stage MOSFET 501 reaches an avalanche voltage, and when the drain current increases, the drain voltage also increases. ΔId/ΔVd is the operating resistance of the surge protection element 66, while the drain voltage when the surge current flows is the operating voltage of the surge protection element 66. The dotted line in FIG. 10 indicates a variation in current-voltage characteristics caused by manufacturing variation.

Among surges, an ESD surge can be thought of as a high energy pulse generated when an electrically-charged person or thing touches an integrated circuit. The following patent documents have been disclosed as methods of protecting a MOSFET configuring an integrated circuit from the ESD.

In Japanese patent publication no. JP-A-2002-94063, a protective thyristor is formed on the same chip in order to protect a MOSFET configuring an integrated circuit from an ESD. It is described that, by the protective thyristor formed in a separate place on the same chip being caused to break down before the MOSFET configuring the integrated circuit enters an avalanche condition when an ESD surge is applied, the MOSFET is protected.

Also, in Japanese patent publication no. JP-A-2005-183499, the drain-to-source distance of a MOSFET configuring an integrated circuit is partially shorter, and this portion forms a protective thyristor portion. It is described that, by the breakdown voltage of the protective thyristor portion being lower than the breakdown voltage of the MOSFET portion, and the protective thyristor portion being turned on when an ESD surge is applied, thereby creating a state of low impedance, the MOSFET is protected.

Also, in Japanese patent publication no. JP-A-2007-294614, it is described that a p-type region is formed sandwiching an n-type drain so as to oppose an n-type source, and an n-type region is formed on the outer side of the p-type region so as to be in contact with a p-type isolation region, thereby forming a p-n-p transistor.

Also, in Japanese patent publication no. JP-A-2001-320047, it is described that a thyristor structure is obtained by a p-type anode layer being formed adjacent to an n-type drain and in contact with a drain electrode.

However, the semiconductor device 500 of FIGS. 7 to 9 is such that, as the surge protection element 66 is the parasitic diode 65, which is formed in each cell 54a, variation occurs in the avalanche voltage in each cell 54a when there is manufacturing variation. When a surge such as an ESD is applied, the surge current concentrates in a cell 54a with a low avalanche voltage rather than all the cells 54a operating in unison, snap-back occurs over a small area in a parasitic transistor 70, as shown in FIG. 10, and the parasitic transistor 70 is destroyed.

Also, as the area occupied by the active region 68 in which the cells 54a are formed is large in comparison with that of the guard ring 32, there is a tendency for the in-plane variation (i.e., manufacturing variation) of the diffusion concentration and diffusion depth to increase in the active region 68. When there is manufacturing variation in this way, variation occurs in the operating resistance and operating voltage of the surge protection element 66, the surge current concentrates in the parasitic diode 65, which has low operating resistance and operating voltage, and the surge protection function depreciates. That is, the conventional semiconductor device 500 is such that the evenness of the surge protection function is liable to be affected by manufacturing variation.

Further, the device described in Japanese patent publication no. JP-A-2002-94063 is such that, as the protective thyristor is formed in a separate place on the same chip, the chip area increases. Also, as the protective thyristor is formed in a separate region, it may happen that the breakdown voltages of the protective thyristor and the MOSFET configuring the integrated circuit are reversed due to variations in the manufacturing process, and protection of the MOSFET becomes difficult.

Also, the device described in Japanese patent publication no. JP-A-2005-183499 is such that there are problems in that, as the drift length differs between the MOSFET portion and thyristor portion, the current flows unevenly, and furthermore, as the width W of the MOSFET portion is small, the on-state voltage of the MOSFET increases.

Still further, in Japanese patent publication no. JP-A-2007-294614, it is described that the p-n-p transistor, which is an ESD protection element, is formed in contact with the p-type isolation region, but there is no description of forming a parasitic bipolar transistor on a guard ring configuring a MOS transistor.

Also, the device described in Japanese patent publication no. JP-A-2001-320047 is such that a protective thyristor is formed in each cell, because of which, when there is manufacturing variation among the cells, surge current caused by an ESD surge concentrates in a specific cell as an effect of the variation, and destruction is likely.

Moreover, in Japanese patent publication nos. JP-A-2002-94063, JP-A-2005-183499, JP-A-2007-294614, and JP-A-2001-320047, there is no description of forming the ESD protection element collectively in a place in which the guard ring of the output stage MOSFET is formed. Thus, as is described above, there are needs in the art for improved semiconductor devices including surge protection elements.

SUMMARY OF THE INVENTION

Embodiments of the invention address these and other needs. As such, embodiments of the invention provide a compact semiconductor device having a surge protection element, which can reliably protect against surge and is unlikely to be affected by manufacturing variation, thereby solving the above-described problems.

According to a first aspect of the invention, a semiconductor device includes a second conductivity type first semiconductor region disposed in a surface layer of a first conductivity type semiconductor substrate, an active region disposed in a surface layer of the first semiconductor region, a first conductivity type second semiconductor region, of a higher concentration than the semiconductor substrate, disposed enclosing the active region, straddling the first semiconductor region and semiconductor substrate and in contact with the two, a first conductivity type third semiconductor region, of a higher concentration than the second semiconductor region, disposed in a surface layer of the second semiconductor region, and a second conductivity type fourth semiconductor region disposed in a surface layer of the second semiconductor region between the third semiconductor region and active region, wherein a guard ring is configured of the second semiconductor region and third semiconductor region, a parasitic bipolar transistor is configured of the fourth semiconductor region, second semiconductor region, and first semiconductor region, and the parasitic bipolar transistor forms a surge protection element.

Also, according to a second aspect of the invention, a semiconductor device includes a second conductivity type first semiconductor region selectively disposed in a surface layer of a first conductivity type semiconductor substrate, a first conductivity type plurality of second semiconductor regions disposed in a surface layer of the first semiconductor region, a plurality of second conductivity type drain regions, disposed distanced from the second semiconductor region in a surface layer of the first semiconductor region, disposed alternately with the second semiconductor region, a second conductivity type source region disposed in a surface layer of the second semiconductor region, a first conductivity type contact region disposed in contact with the source region in a surface layer of the second semiconductor region, an oxide film selectively disposed on the first semiconductor region, a gate electrode disposed across a gate insulating film on the second semiconductor region sandwiched by the first semiconductor region and source region, a drain electrode connected to the drain region, a source electrode connected to the source region and contact region, a first conductivity type third semiconductor region, disposed straddling the first semiconductor region and semiconductor substrate and in contact with the two, disposed so as to enclose the second semiconductor region group, a first conductivity type fourth semiconductor region, of a higher concentration than the third semiconductor region, disposed in a surface layer of the third semiconductor region, a second conductivity type fifth semiconductor region disposed in a surface layer of the third semiconductor region between the fourth semiconductor region and second semiconductor region, and a ground electrode connected to the fourth semiconductor region and fifth semiconductor region, wherein the fifth semiconductor region is disposed opposing the drain region disposed between the second semiconductor region and third semiconductor region, a guard ring is configured of the first semiconductor region and third semiconductor region, and a surge protection element is configured of a parasitic bipolar transistor formed of the first semiconductor region, third semiconductor region, and fifth semiconductor region.

Also, according to a third aspect of the invention, it is preferable that the semiconductor device according to the second aspect of the invention is such that the distance between the third semiconductor region and drain region is shorter than the distance between the second semiconductor region and drain region.

Also, according to a fourth aspect of the invention, it is preferable that the semiconductor device according to the second aspect of the invention is such that the second semiconductor region, drain region, and fifth semiconductor region are alternately disposed in parallel in an elongated planar form, and the width in a direction perpendicular to the longitudinal direction of the fifth semiconductor region is greater than the width in a direction perpendicular to the longitudinal direction of the source region.

Also, according to a fifth aspect of the invention, it is preferable that the semiconductor device according to the fourth aspect of the invention is such that the planar form of the fourth semiconductor region is insular, and the fifth semiconductor region extends into gaps in the insular fourth semiconductor region.

Also, according to a sixth aspect of the invention, it is preferable that the semiconductor device according to the second aspect of the invention is such that the diffusion depth of the third semiconductor region is selectively shallow.

Also, according to a seventh aspect of the invention, it is preferable that the semiconductor device according to the second aspect of the invention is such that the drain region is replaced with a first conductivity type collector region and a lateral MOS field effect transistor (MOSFET) is changed to a lateral insulated gate bipolar transistor (IGBT).

According to embodiments of the invention, by forming a parasitic bipolar transistor on the guard ring, and adopting the parasitic bipolar transistor as a surge protection element, it is possible to provide a compact semiconductor device having a surge protection element.

Also, by adopting, in some embodiments, the parasitic bipolar transistor as a surge protection element, it is possible to reduce the operating resistance in comparison with when using a parasitic diode as a surge protection element, and thus possible to improve the surge protection function.

Also, by providing, in some embodiments, one surge protection element on the guard ring, rather than providing a surge protection element in each cell, it is possible to make it difficult for the surge protection function to be affected by manufacturing variation (in-plane variation).

BRIEF DESCRIPTION OF THE DRAWINGS

FIGS. 2A and 2B are enlarged views of an A portion of FIG. 1, wherein

FIGS. 8A and 8B are enlarged views of a B portion of FIG. 7, wherein

DETAILED DESCRIPTION

Embodiments of the invention are described below using the following working examples.

WORKING EXAMPLE 1

Figure 1:
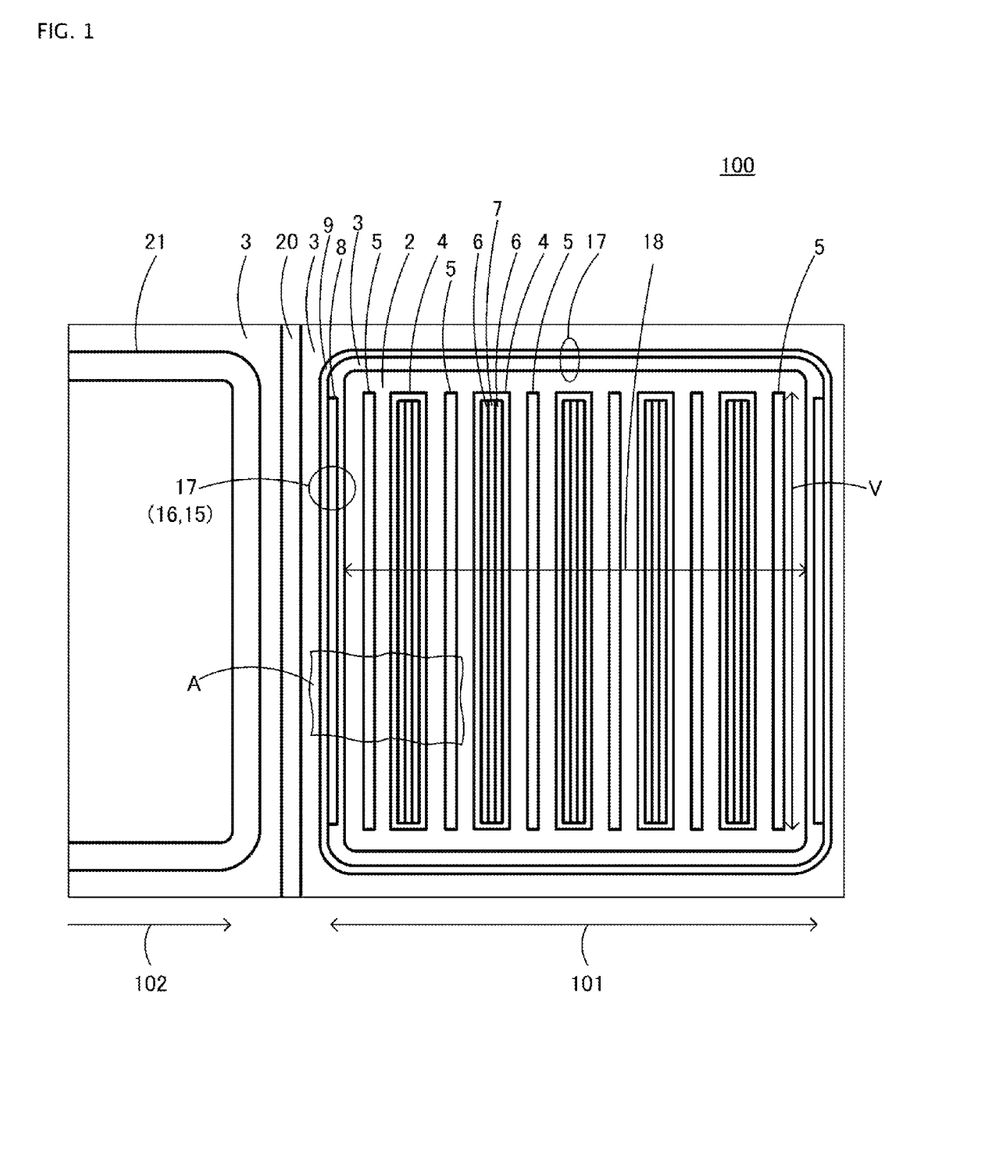
FIG. 1 is a main portion plan view of a semiconductor device 100 according to a first working example (or embodiment) of the invention.
Figure 2A:
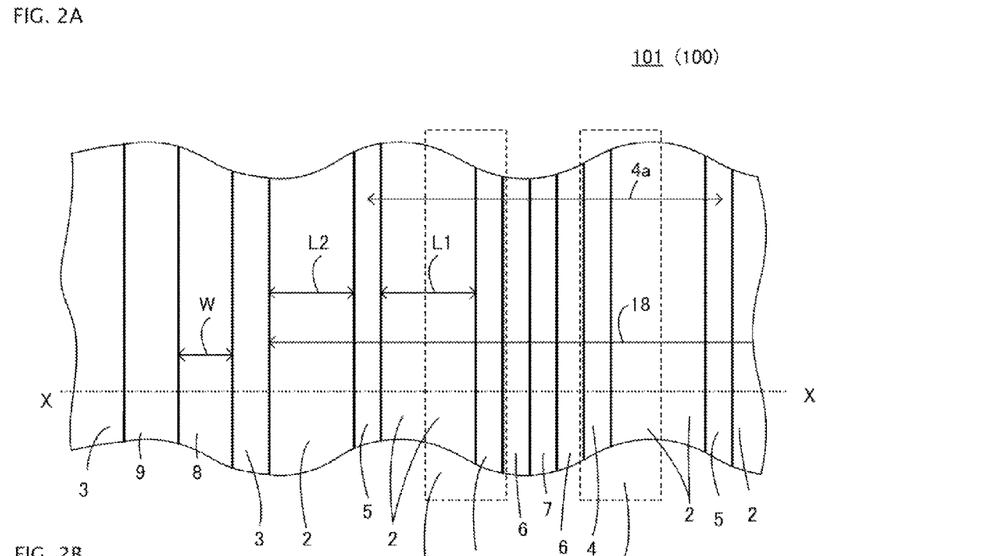
FIG. 2A is a main portion plan view of an output stage MOSFET.
Figure 2B:
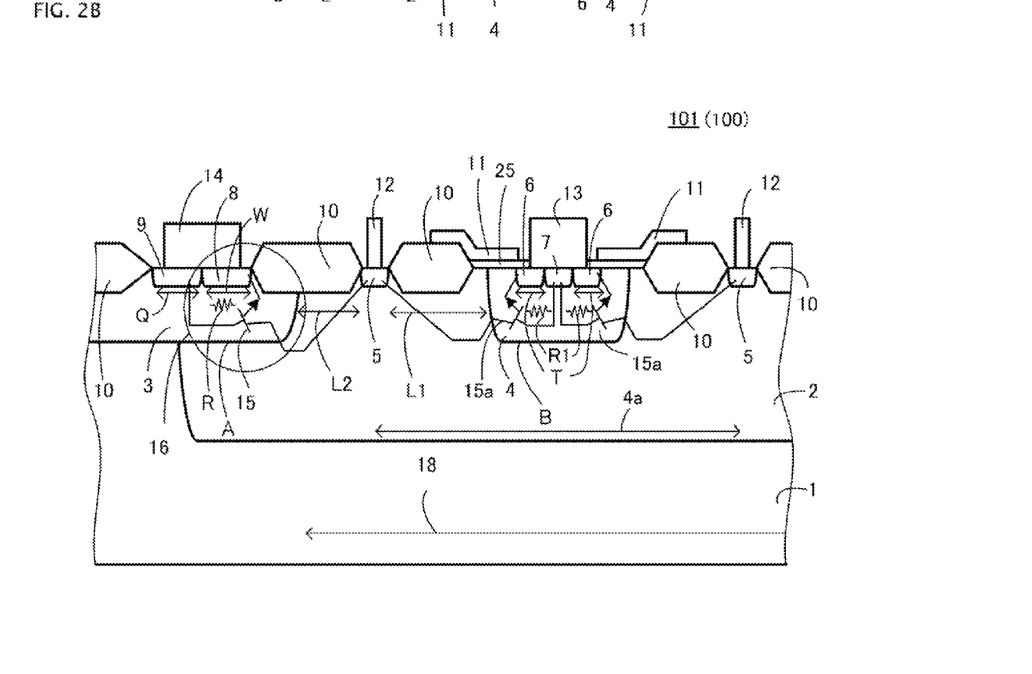
FIG. 2B is a main portion sectional view taken along an X-X line of FIG. 2A.
Figure 3:
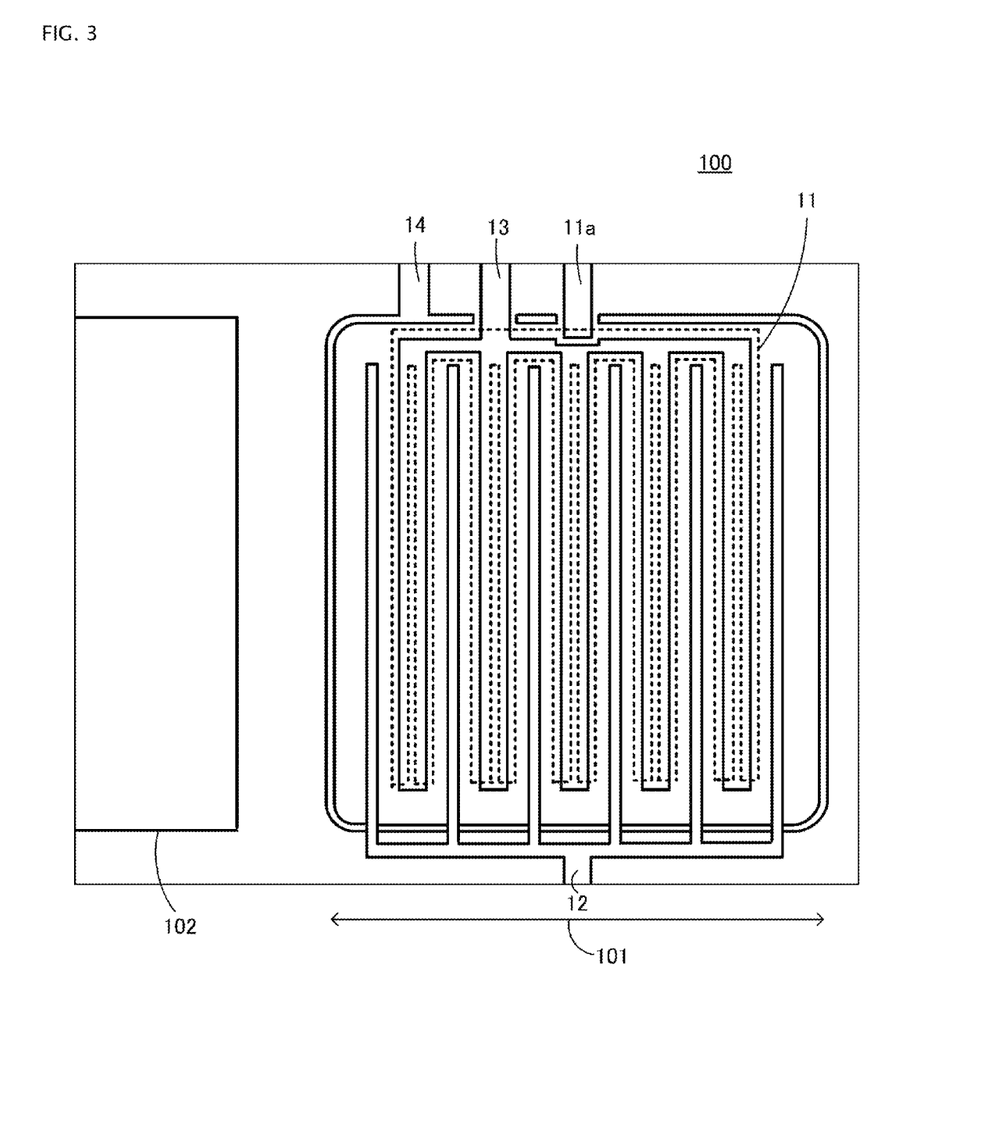
FIG. 3 is a main portion plan view of electrode wiring of the semiconductor device 100 of FIG. 1.

FIG. 1 is a main portion plan view of a semiconductor device 100 according to a first working example of the invention. FIGS. 2A and 2B are enlarged views of an A portion of FIG. 1, wherein FIG. 2A is a main portion plan view of an output stage MOSFET, and FIG. 2B is a main portion sectional view taken along an X-X line of FIG. 2A. FIG. 3 is a main portion plan view of electrode wiring of the semiconductor device 100 of FIG. 1.

In FIGS. 1 to 3, the semiconductor device 100 has a surge protection element 16, and the surge protection element 16 is configured of a parasitic transistor 15 formed on a guard ring 17. The surge protection element 16 is an ESD protection element, or the like.

The semiconductor device 100 includes an n-type well region 2 of, for example, a dose of in the region of $3 \times 10^{12}$ cm$^{-2}$ and a diffusion depth of in the region of 8 μm disposed in a surface layer of a p-type semiconductor substrate 1 of a resistivity of, for example, in the region of 100 Ω·cm to 150 Ω·cm. Also, the semiconductor device 100 includes a plurality of (lateral n-type MOSFET) stripe-form p-type well regions 4 of, for example, a dose of in the region of $1.6 \times 10^{13}$ cm$^{-2}$ and a diffusion depth of in the region of 3 disposed in the n-type well region 2 and configuring a cell 4a of an output stage MOSFET 101. Also, the semiconductor device 100 includes stripe-form n-type source regions 6 of, for example, a dose of in the region of $2 \times 10^{15}$ cm$^{-2}$ and a diffusion depth of in the region of 0.5 μm, disposed in a surface layer of the p-type well region 4. Also, the semiconductor device 100 includes a stripe-form p-type contact region 7 disposed sandwiched by the n-type source regions 6. The semiconductor device 100 includes a gate electrode 11, formed of polysilicon, disposed across a gate oxide film 25 on the p-type well region 4 sandwiched by the n-type source region 6 and n-type well region 2, and a stripe-form n-type drain region 5 disposed distanced from the p-type well region 4. A LOCOS 10 (selective oxide film) is disposed between the p-type well region 4 and n-type drain region 5. The semiconductor device 100 includes a p-type well region 3 of, for example, a dose of in the region of $1.6 \times 10^{13}$ cm$^{-2}$ and a diffusion depth of in the region of 3 μm, disposed so as to enclose the p-type well region 4 group, a ring-form p$^+$ region 9 disposed in a surface layer of the p-type well region 3, and a stripe-form n$^+$ region 8 of, for example, a dose of in the region of $2\times10^{15}$ cm$^{-2}$ and a diffusion depth of in the region of 0.5 μm, disposed so as to be in contact with the p$^+$ region 9 and to oppose the p-type well region 4 on the inner side of the p$^+$ region 9. The guard ring 17 is configured of the p-type well region 3 and p$^+$ region 9. The p$^+$ region 9 has a function of stabilizing the potential of the guard ring 17 at the ground potential. Also, in FIG. 1, the n$^+$ region 8 is disposed so as to oppose the stripe-form n-type drain region 5, and so as to be the same length as a length V of the n-type drain region 5. However, the n$^+$ region 8 may also be disposed in a ring-form, or disposed divided into a plurality. When the n$^+$ region 8 is disposed in a ring-form, AI wiring (drain electrode wiring 12, or the like) passes over the n$^+$ region 8, as shown in FIG. 3, and the potential of the n$^+$ region 8 is liable to become unstable, which is not desirable.

The parasitic transistor 15 is configured of the n$^+$ region 8, p-type well region 3, and n-type well region 2, and the parasitic transistor 15 forms the surge protection element 16.

An n-type well region 21 forming an integrated circuit 102 (an internal circuit) is formed distanced from the n-type well region 2 in a surface layer of the p-type semiconductor substrate 1. The n-type well region 21 is in contact with the p-type well region 3, and a p$^+$ region 20 is disposed in the p-type well region 3 between the n-type well region 2 and n-type well region 21. The p$^+$ region 20 is an isolation region that electrically isolates the output stage MOSFET 101 and integrated circuit 102.

A distance L2 of the n-type well region 2 (drift region) between the p-type well region 3 of the guard ring and the n-type drain region 5 of the output stage MOSFET 101 is shorter than a distance L1 of the n-type well region 2 between the p-type well region 4 and n-type drain region 5 of the output stage MOSFET 101. This is in order that avalanche will occur in a p-n junction A between the p-type well region 3 and n-type well region 2 on the guard ring 17 side before occurring in a p-n junction B between the p-type well region 4 and n-type well region 2 when a surge such as an ESD is applied to the n-type drain region 5. By avalanche occurring first in the p-n junction A between the p-type well region 3 and n-type well region 2 of the guard ring 17, the parasitic transistor 15 formed on the guard ring 17 starts operating, and can reliably protect the semiconductor device 100 from the surge.

Also, as described above, the p$^+$ region 9 spreads beyond the p-type well region 3, and encloses an active region 18 of the output stage MOSFET 101. The cell 4a configuring the active region 18 of the output stage MOSFET 101 ranges from the center of the p-type contact region 7 to the n-type drain region 5, is configured of the n-type source region 6, p-type well region 4, n-type drift region (n-type well region 2), and n-type drain region 5, and a plurality thereof are disposed.

The output stage MOSFET 101 is a lateral n-type channel MOSFET, each cell 4a is of a stripe-form, and the gate structure is a planar structure.

As described above, the parasitic transistor 15 is disposed on the guard ring 17, and the parasitic transistor 15 is used as the surge protection element 16, which is an ESD protection element or the like. By the parasitic transistor 15 being turned on when a surge such as an ESD is applied, it is possible to protect the integrated circuit 102, which is the internal circuit, from the surge.

As the surge protection element 16 is formed on the guard ring 17 of the output stage MOSFET 101, it is possible to reduce the chip area in comparison with when forming a surge protection element in a place other than the output stage MOSFET 101.

Also, as one surge protection element 16 is provided on the guard ring 17, rather than a surge protection element 16 being provided in each of the plurality of cells 4a configuring the output stage MOSFET 101, the surge protection function is unlikely to be affected by structural variation.

Also, as the surge protection element 16 is formed on the guard ring 17, the formation of the surge protection element 16 does not affect the characteristics of the output stage MOSFET 101.

Also, as the dynamic resistance of the surge protection element 16 of the parasitic transistor 15 is low in comparison with a conventional parasitic diode 65, it is possible to reliably protect the output stage MOSFET 101 and the integrated circuit 102, which forms the internal circuit, from surge.

In FIG. 3, ground electrode wiring 14, gate wiring 11a, source electrode wiring 13, and the drain electrode wiring 12 are formed of aluminum or aluminum alloy wiring, and the wirings are disposed on an unshown interlayer insulating film on the n-type well region 2 or LOCOS 10. Each electrode wiring (12, 13, and 14) and semiconductor region (5, 6, 7, 8, and 9), and the gate electrode 11 and gate wiring 11a, are connected via a contact hole formed in the interlayer insulating film (not shown). Although not shown, the drain electrode 12 connected to the n-type drain region 5 and the source electrode 13 connected to the n-type source region 6 can be formed into a field plate structure by being extended over an interlayer insulating film (not shown) between the source and drain. However, there is no need to form a field plate structure between the drain electrode 12, which is disposed at the outermost end, and the p-type well region 3. This is so that the electric field strength in this place is increased, and the parasitic transistor 15 is switched to an on-state quickly, when a surge is applied.

Figure 4:
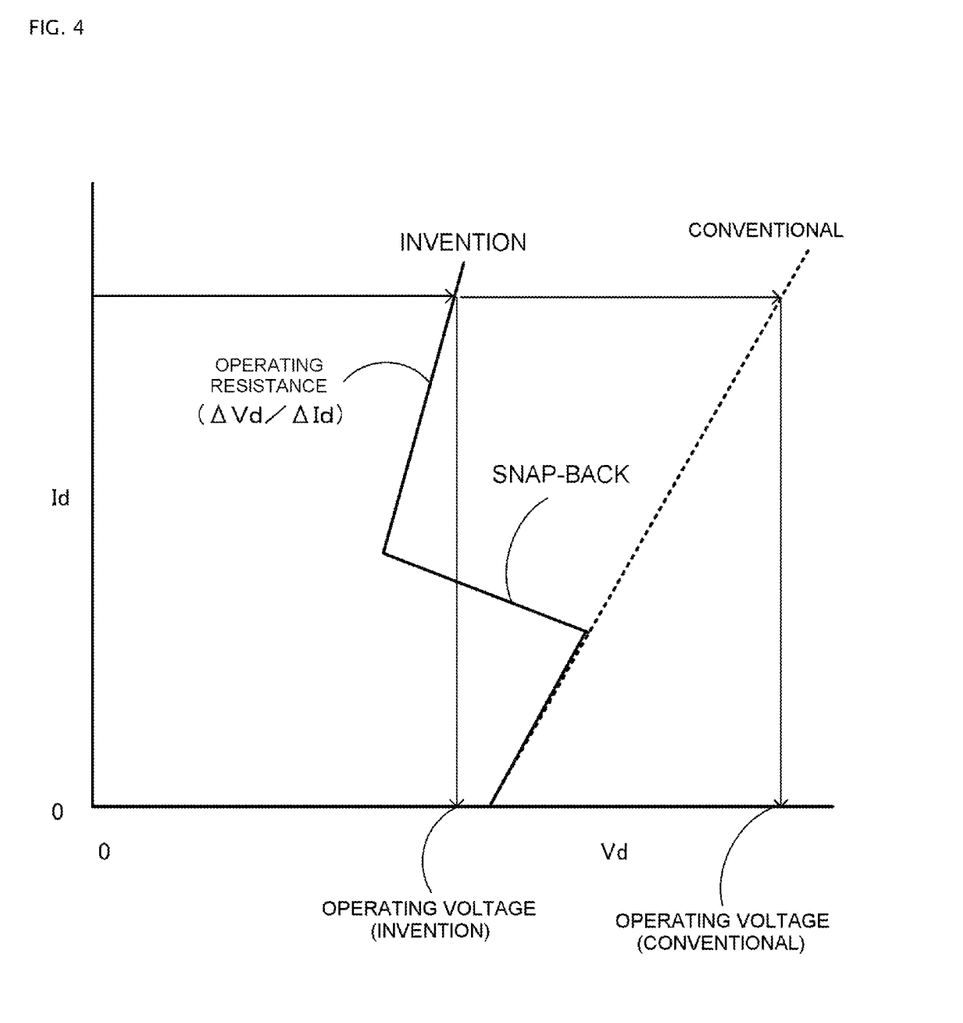
FIG. 4 is a current (Id)-voltage (Vd) characteristic diagram for an output stage MOSFET 101.

FIG. 4 is a current (Id)-voltage (Vd) characteristic diagram for the output stage MOSFET 101. For reference purposes, a current (Id)-voltage (Vd) characteristic diagram for a conventional output stage MOSFET 501 is also shown. Id is the drain current of the output stage MOSFET 101, while Vd is the drain voltage of the output stage MOSFET 101. Id also indicates a surge current flowing through the output stage MOSFET 101 and the collector current of the parasitic transistor 15. Also, Vd also indicates a surge voltage applied to the output stage MOSFET 101 and a surge voltage applied to the parasitic transistor 15.

When a surge such as an ESD is applied to the drain electrode wiring 12 of the output stage MOSFET 101, avalanche occurs at the p-n junction A between the n-type collector region (n-type well region 2) and p-type base region (p-type well region 3) of the parasitic transistor 15. Of the avalanche current, the hole current forms a base current of the parasitic transistor 15, and the potential of the p-type base region (p-type well region 3) rises because of the base current and a base resistance (a lateral resistance R of the p-type base region). Owing to the p-type base region potential rising, electrons are injected from the n-type emitter region (n$^+$ region 8) into the p-type base region (p-type well region 3), and the parasitic transistor 15 is turned on (snap-back). Owing to the snap-back of the parasitic transistor 15, the operating resistance of the parasitic transistor 15 takes on a low state, thus protecting the output stage MOSFET 101 and the integrated circuit 102, which is the internal circuit, from surge.

When the p-type well region 3 and p-type well region 4 are formed simultaneously, the $n^+$ region 8 and n-type source region 6 are formed simultaneously, and the impurity concentrations (doses) and diffusion depths thereof are the same, as previously described, increasing a width W of the $n^+$ region 8 (n-type emitter region) increases the lateral resistance R (base resistance) of the p-type well region 3 (p-type base region) directly below the $n^+$ region 8, and it becomes easier for the parasitic transistor 15 to operate. As a result of this, it is possible to improve the surge protection function.

Also, when the width W of the $n^+$ region 8 is greater than a width T of the n-type source region 6, the lateral resistance R of the p-type well region 3 directly below the $n^+$ region 8 is higher than a lateral resistance R1 of the p-type well region 4 directly below the n-type source region 6. Because of this, the parasitic transistor 15 is turned on before a parasitic transistor 15a formed in the cell 4a, and the role of the surge protection element 16 can be reliably fulfilled.

Also, when a value wherein the width W of the $n^+$ region 8 and a width Q of the $p^+$ region 9 are added together is constant, it is preferable that the width W of the $n^+$ region 8 is in the region of one to five times the width Q of the $p^+$ region 9.

The reason for this is that the surge protection function depreciates when the width W of the $n^+$ region 8 is in the region less than one time the width Q of the $p^+$ region 9. Meanwhile, when the width W of the $n^+$ region 8 is greater than five times the width Q of the $p^+$ region 9, the width Q of the $p^+$ region 9 becomes correspondingly smaller, the surge current density increases, and damage occurs.

Also, when setting the impurity concentration of the p-type base region (p-type well region 4) to be low, the lateral resistance R of the p-type base region increases, and it becomes still easier for the parasitic transistor 15 to operate. As a result of this, it is possible to further improve the surge protection function.

Also, as the one surge protection element 16 is formed on the guard ring 17 in an outer peripheral portion of the output stage MOSFET 101, there is less likely to be an effect of manufacturing variation in comparison with a surge protection element 66 of a conventional semiconductor device 500 of FIG. 7. This is because, as the area occupied by the parasitic transistor 15 is small in comparison with the area occupied by the parasitic diode 65, the in-plane variation in diffusion concentration and diffusion depth decreases.

WORKING EXAMPLE 2

Figure 5:
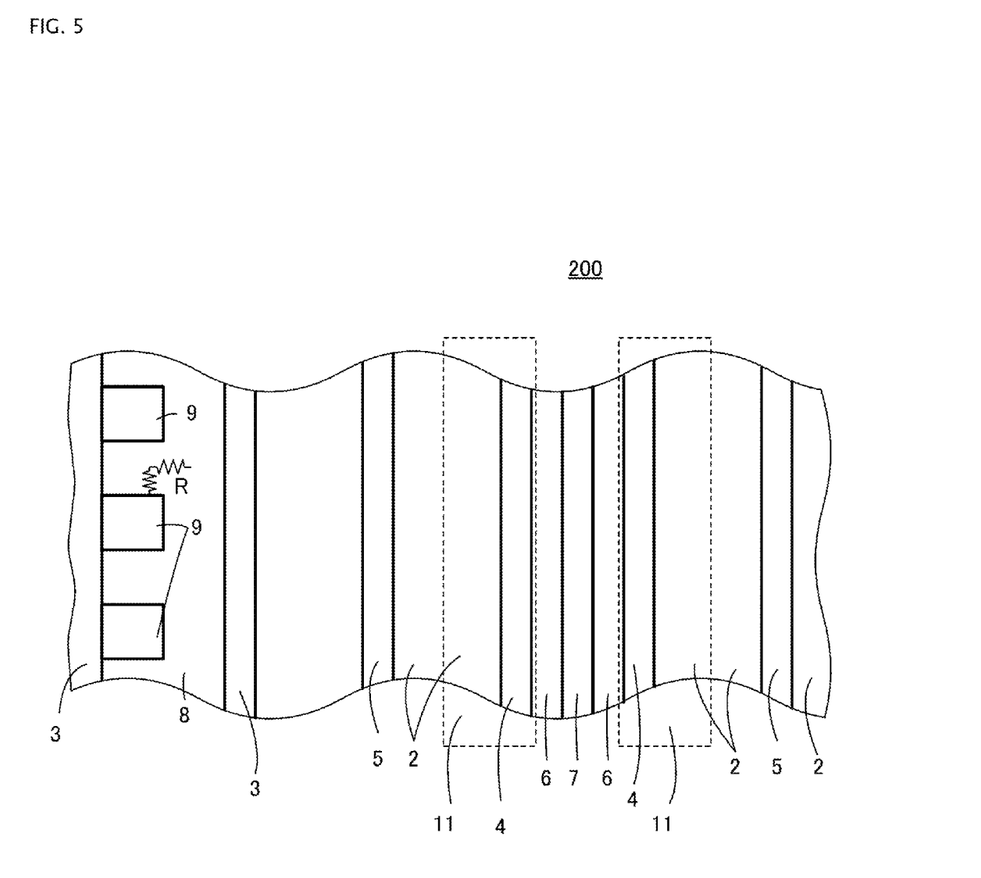
FIG. 5 is a main portion plan view of a semiconductor device 200 according to a second working example (or embodiment) of the invention.

FIG. 5 is a main portion plan view of a semiconductor device 200 according to a second working example of the invention. Differences from the semiconductor device 100 of the first working example are that the $p^+$ region 9 is formed in insular form, and that the $n^+$ region 8 configuring the parasitic transistor 15 is partially widened.

By the planar form of the $p^+$ region 9 being an insular form, the planar form of the $n^+$ region 8 being a comb tooth form (irregular form), and the $n^+$ region 8 extending into gaps in the $p^+$ region 9, the area of the n-type emitter region ($n^+$ region 8) increases, and the path of a lateral current flowing through the p-type well region 3 directly below the n-type emitter region lengthens. As a result of this, the lateral resistance R of the p-type base region (p-type well region 3) increases, and it becomes easier for the parasitic transistor 15 to operate. As a result of this, it is possible to improve the surge protection function.

WORKING EXAMPLE 3

Figure 6:
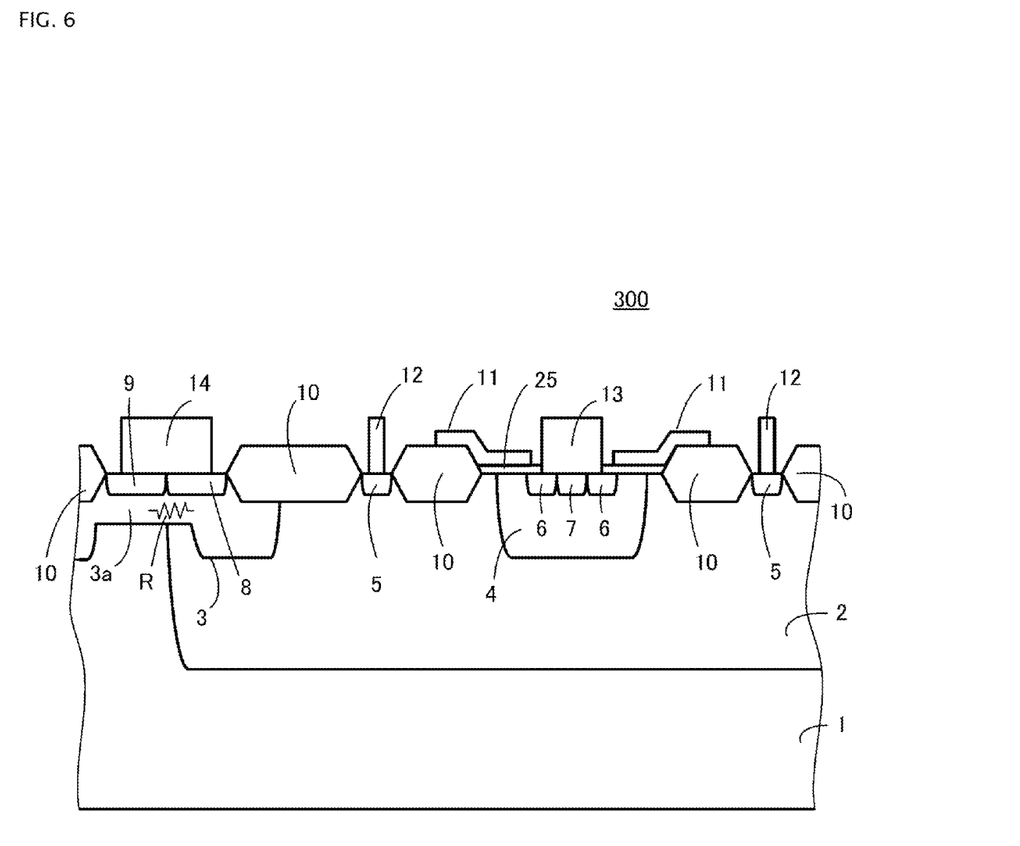
FIG. 6 is a main portion sectional view of a semiconductor device 300 according to a third working example (or embodiment) of the invention.

FIG. 6 is a main portion sectional view of a semiconductor device 300 according to a third working example of the invention. A difference from the semiconductor device 100 of the first working example is that one portion of the p-type base region (p-type well region 3) below the $n^+$ region 8 and $p^+$ region 9 is formed to be shallow. By one portion of the p-type base region directly below the n-type emitter region ($n^+$ region 8) being formed to be shallow, the lateral resistance R of the p-type base region ($p^+$ region 9) increases, and it becomes easier for the parasitic transistor 15 to operate. As a result of this, it is possible to improve the surge protection function.

Some Advantages of Embodiments of the invention include the following. 1) By forming the parasitic transistor 15 on the guard ring 17, and adopting the parasitic transistor 15 as the surge protection element 16, it is possible to provide the compact semiconductor devices 100 to 300 having the surge protection element 16.

2) By adopting the parasitic transistor 15 as the surge protection element 16, it is possible to reduce the operating resistance in comparison with when using the parasitic diode 65 as the surge protection element 66, and thus possible to improve the surge protection function.

3) By providing one surge protection element 16 on the guard ring 17, rather than providing a surge protection element 16 in each cell 4a, it is possible to make it difficult for the surge protection function to be affected by manufacturing variation (in-plane variation).

4) As the surge protection element 16 is formed on the guard ring 17, the characteristics (breakdown voltage, on-state voltage) of the output stage MOSFET 101 are not affected.

In each working example, the n-type drain region 5 may be replaced with a p-type collector region, and the lateral MOSFET changed to a lateral insulated gate bipolar transistor (IGBT).

Also, although an explicit description is omitted, Working Examples 1 to 3 may be combined, as would be understood by one of skill in the art, as instructed by the present disclosure. As such, examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2012-177003, filed on Aug. 9, 2012. The disclosure of the priority application, in its entirety, including the drawings, claims, and the specification thereof, is incorporated herein by reference.

What is claimed is:
1. A semiconductor device, comprising:
   a second conductivity type first semiconductor region disposed in a surface layer of a first conductivity type semiconductor substrate;

an active region disposed in a surface layer of the first semiconductor region, the active region being part of a protected device;

a first conductivity type second semiconductor region, of a higher concentration than the semiconductor substrate, disposed enclosing the active region, straddling, and in contact with, the first semiconductor region and semiconductor substrate;

a first conductivity type third semiconductor region, of a higher concentration than the second semiconductor region, disposed in a surface layer of the second semiconductor region; and a second conductivity type fourth semiconductor region disposed in a surface layer of the second semiconductor region between the third semiconductor region and active region, wherein a guard ring is configured of the second semiconductor region and third semiconductor region, a parasitic bipolar transistor is configured of the fourth semiconductor region, second semiconductor region, and first semiconductor region, and the parasitic bipolar transistor forms an electrostatic discharge (ESD) surge protection element.

2. A semiconductor device, comprising:

a second conductivity type first semiconductor region selectively disposed in a surface layer of a first conductivity type semiconductor substrate;

a first conductivity type plurality of second semiconductor regions disposed in a surface layer of the first semiconductor region, the plurality of second semiconductor regions being part of a protected device;

a plurality of second conductivity type drain regions, disposed distanced from the second semiconductor region in a surface layer of the first semiconductor region, disposed alternately with the second semiconductor region;

a second conductivity type source region disposed in a surface layer of the second semiconductor region;

a first conductivity type contact region disposed in contact with the source region in a surface layer of the second semiconductor region;

an oxide film selectively disposed on the first semiconductor region;

a gate electrode disposed across a gate insulating film on the second semiconductor region sandwiched by the first semiconductor region and source region;

a drain electrode connected to the drain region;

a source electrode connected to the source region and contact region;

a first conductivity type third semiconductor region, disposed straddling, and in contact with, the first semiconductor region and semiconductor substrate, and disposed so as to enclose the second semiconductor region group;

a first conductivity type fourth semiconductor region, of a higher concentration than the third semiconductor region, disposed in a surface layer of the third semiconductor region;

a second conductivity type fifth semiconductor region disposed in a surface layer of the third semiconductor region between the fourth semiconductor region and second semiconductor region; and a ground electrode connected to the fourth semiconductor region and fifth semiconductor region, wherein the fifth semiconductor region is disposed opposing the drain region disposed between the second semiconductor region and third semiconductor region, a guard ring is configured of the first semiconductor region and third semiconductor region, and an electrostatic discharge (ESD) surge protection element is configured of a parasitic bipolar transistor formed of the first semiconductor region, third semiconductor region, and fifth semiconductor region.

3. The semiconductor device according to claim 2, wherein the distance between the third semiconductor region and drain region is shorter than the distance between the second semiconductor region and drain region.

4. The semiconductor device according to claim 2, wherein the second semiconductor region, drain region, and fifth semiconductor region are alternately disposed in parallel in an elongated planar form, and the width in a direction perpendicular to the longitudinal direction of the fifth semiconductor region is greater than the width in a direction perpendicular to the longitudinal direction of the source region.

5. The semiconductor device according to claim 3, wherein the second semiconductor region, drain region, and fifth semiconductor region are alternately disposed in parallel in an elongated planar form, and the width in a direction perpendicular to the longitudinal direction of the fifth semiconductor region is greater than the width in a direction perpendicular to the longitudinal direction of the source region.

6. The semiconductor device according to claim 4, wherein the planar form of the fourth semiconductor region is insular, and the fifth semiconductor region extends into gaps in the insular fourth semiconductor region.

7. The semiconductor device according to claim 2, wherein the diffusion depth of the third semiconductor region is selectively shallow.

8. The semiconductor device according to claim 2, wherein the drain region is replaced with a first conductivity type collector region and a lateral MOS field effect transistor is changed to a lateral insulated gate bipolar transistor.

* * * * *